US008686530B2

(12) United States Patent
Sele et al.

(10) Patent No.: US 8,686,530 B2
(45) Date of Patent: Apr. 1, 2014

(54) ELECTRONIC COMPONENT AND A METHOD OF MANUFACTURING AN ELECTRONIC COMPONENT

(75) Inventors: Christoph Wilhelm Sele, London (GB); Monica Johanna Beenhakkers, Helmond (NL); Gerwin Hermanus Gelinck, Valkenswaard (NL); Nicolaas Aldegonda Jan Maria Van Aerle, Eindhoven (NL); Hjalmar Edzer Ayco Huitema, Veldhoven (NL)

(73) Assignee: Creator Technology B.V., Breda (NL)

( * ) Notice: Subject to any disclaimer, the term of this patent is extended or adjusted under 35 U.S.C. 154(b) by 506 days.

(21) Appl. No.: 12/669,676

(22) PCT Filed: Jul. 16, 2008

(86) PCT No.: PCT/NL2008/050481
§ 371 (c)(1),
(2), (4) Date: Jun. 7, 2010

(87) PCT Pub. No.: WO2009/011580
PCT Pub. Date: Jan. 22, 2009

(65) Prior Publication Data
US 2010/0320448 A1    Dec. 23, 2010

Related U.S. Application Data

(60) Provisional application No. 60/950,254, filed on Jul. 17, 2007.

(51) Int. Cl.
*H01L 29/02* (2006.01)
(52) U.S. Cl.
USPC ..................... 257/487; 257/E21.01
(58) Field of Classification Search
USPC ................. 257/40, E21.576, 487, E21.01
See application file for complete search history.

(56) References Cited

U.S. PATENT DOCUMENTS

2004/0075093 A1   4/2004   Arai et al.
2006/0180808 A1   8/2006   Hsieh

FOREIGN PATENT DOCUMENTS

| CN | 1398007 A | 2/2003 |
|---|---|---|
| CN | 1838446 A | 9/2006 |
| EP | 0 975 018 A | 1/2000 |
| JP | 2001-77086 | 3/2001 |
| JP | 2002-237594 | 8/2002 |
| TW | 544792 | 8/2003 |
| TW | I243460 | 11/2005 |
| TW | 200631139 | 9/2006 |
| WO | WO 2006/061589 A | 6/2006 |

OTHER PUBLICATIONS

English Translation Chinese Examiner's Discussion.
English Translation TW 200631139A.
International Search Report dated Nov. 3, 2008 for PCT/NL2008/050481.
Japan Patent Office, Office Action, Patent Application Serial No. 2010-516943, Oct. 2, 2012, Japan.
Taiwan Patent Office, Office Action, Patent Application Serial No. 097126002, Mar. 5, 2013, Taiwan.
China Patent Office, Office Action, Patent Application Serial No. 200880101248.X, Mar. 27, 2013, China.

*Primary Examiner* — Amar Movva

(57) ABSTRACT

An electronic component, notably one including, for example, a TFT, a storage capacitor, or a crossing between electrically conductive layers of a stack device is disclosed. The electronic component comprises a substrate whereon a first electrically conductive layer forming electrode is provided. A second electrode formed by a second electrically conductive layer is separated from the first electrode by at least a dielectric layer, comprising an interlayer of an electrically insulating material, preferably having high resistance against electrical breakdown and a further layer of a photopatternable electrically insulating material.

6 Claims, 3 Drawing Sheets view (a)

view (b)

view (c)

ELECTRONIC COMPONENT AND A METHOD OF MANUFACTURING AN ELECTRONIC COMPONENT

FIELD OF THE INVENTION

The invention relates to an electronic component comprising a stack with a first electrically conductive layer and a second electrically conductive layer separated at least by a dielectric layer. The invention further relates to a method of manufacturing such an electronic component.

BACKGROUND OF THE INVENTION

Electronic circuits, such as complementary metal-oxide-semiconductor (CMOS) circuits, p-channel metal-oxide-semiconductor circuits (PMOS), or n-channel metal-oxide-semiconductor circuits (NMOS), comprise a number of active and passive electronic components, such as thin-film transistors (TFTs) and capacitors. A typical TFT architecture comprises a suitably doped semiconductor wherein, or adjacent to which, drain and source regions are provided, said semiconductor being separated from a gate electrode by a suitable dielectric material. Usually a single TFT is implemented as a stack comprising a substrate, a first electrically conductive layer, a semiconductor, a dielectric, and a second electrically conductive layer. An electronic circuit may comprise a plurality of such electronic components, notably capacitors, thin film transistors (TFTs), as well as crossings of conducting layers, leading to a geometry of a dielectric layer being substantially sandwiched between the first and the second electrically conducting layers.

It is appreciated in the art of semiconductor technology that for many electronic circuit components a reduction in dielectric thickness improves their electrical characteristics, like switching speed, operating voltage, power consumption. In addition, miniaturization of critical lateral device dimensions, e.g. TFT channel length, necessitates a simultaneous reduction of the dielectric thickness, to ensure basic device scaling rules. It is generally known in semiconductor physics that when the channel length of a TFT becomes too short, its switching characteristics become less defined. Such short-channel effects include poor sub-threshold slope, shift of threshold voltage, and failure or current saturation, and are generally not desired. These phenomena are addressed in "Physics of Semiconductor Devices" by S. M. Sze, Wiley & Sons (New York), 1981. By simultaneously scaling down the dielectric thickness these short-channel effects can be avoided. Thus, to reach higher switching speeds, which is usually achieved by reducing the channel length, it is also necessary to scale down the dielectric thickness.

In addition, it is desirable to reduce the surface area of storage capacitors to reduce the risk of electrical shorts. This requires employment of thinner and/or higher permittivity dielectric layers.

However, with decreasing dielectric thickness, the risk of electrical shorts between electrically conductive layers on opposite sides of the dielectric layer increases. This phenomenon is usually referred to as breakdown. For some dielectrics electrical breakdown can depend not only on the applied voltage, but also on the duration of the applied voltage and the total amount of current flowing through the dielectric. Photosensitive materials, in particular, often exhibit relatively poor breakdown behavior. This can be attributed to their relatively high ion content, for example due to the use of photoinitiator materials (mixed into a photoresist) that contain or can form ionic components or radicals to create a suitable chemical reaction of the photoresist upon exposure to (UV) light during (UV) photo-lithography.

SUMMARY OF THE INVENTION

It is an object of the invention to provide an electronic component, such as a thin film transistor, a storage capacitor, or a crossing of electrically conductive layers, wherein the risk of electrical breakdown is decreased leading to an improved operational lifetime of such electronic component and, as a consequence, of a device comprising such electronic components.

To this end in the electronic component according to the invention the dielectric layer comprises an interlayer of an electrically insulating material at least partially covered by a further layer of a photo-patternable electrically insulating material.

It has been found that by providing an additional interlayer of a dielectric material with high time-dependent electrical breakdown strength, such as a high time-dependent electrical breakdown organic or inorganic electrical insulator to a dielectric layer comprising a photo-patternable material results in a dielectric bi-layer having a substantial improvement of the time-dependent breakdown characteristics. Since the electrically insulating layer forming the interlayer is located at a lower position in the thus formed dielectric bi-layer and is not directly photo-patternable, the photo-patternable top layer can be used as a mask for the pattering of the interlayer. Such bi-layers can be used for gate dielectric and storage capacitor dielectric as well as for the insulator between crossings of electrically conducting layers. Preferably, polymers are used for the interlayer. The interlayer consists, for example, of a stack of layers of more than one material.

The bi-layer in the electronic component according to the invention has an additional advantage, because use of a photo-patternable, notably organic, material for an upper layer of the dielectric bi-layer reduces a number of required processing steps, for example for the patterning of vias. Photo-patternable materials generally have relatively high ion content and related poor electrical time-dependent breakdown characteristics. By providing a bi-layer in accordance with the invention a dielectric is provided which combines advantages of photo-sensitivity (photo-patternable layer) and low ion content or mobility (interlayer). It is further found that dielectric layers, in particular, photosensitive layers, enable simple, economic deposition and patterning. Such dielectric material is an important component for low-cost organic electronics, notably for electronic devices comprising flexible displays.

It is noted that a suitable semiconductor layer may be present between the first electrically conductive layer and the interlayer, as well as between the further layer of photo-patternable material and the second electrically conductive layer.

To create interconnections between electrically conductive, notably metal, layers on opposite sides of the dielectric stack the interlayer comprising an insulator material can be deposited on the top of the first electrically conductive layer, followed, for example, by spin-coating of the photo-patternable layer. The interlayer comprising an insulating material at least partially covered by the photo-patternable layer may constitute a dielectric layer of the TFT, a storage capacitor, or a crossing of two electrically conducting layers. After structuring the photo-patternable layer using, for example, standard UV lithography or a laser, the underlying interlayer may be removed using a suitable etchant or a solvent. Dissolution is preferred over wet chemical etching or dry etching, to prevent undesirable modification of a dielectric surface. This is particularly important if the subsequent layer with respect to the dielectric bi-layer is, for example, an organic semiconductor that is sensitive to changes in surface chemistry.

By using the overlying photo-patternable layer, forming a part of the electronic component according to the invention, as a mask for suitable patterning of the interlayer comprising the insulator material, no additional mask steps (e.g., aligning and exposure) are necessary. Preferably, the interlayer is chosen to be soluble in a suitable developer solution of the further layer (photoresist). Thus, the area of the photo-patternable layer exposed to UV radiation and underlying regions of the interlayer comprising the insulator material is removable in a single step, in a case where a positive type of photo-patternable material is used. In a case where a negative type of photo-patternable material is used, the area of the photo-patternable layer not-exposed to UV radiation and underlying regions of the interlayer comprising the insulator material can be removed in a single step. To prevent under-etching of the interlayer comprising the insulator material, its solubility in the common developer preferably does not exceed the solubility of the photo-patternable layer therein. Preferably, the insulator material is inorganic. Preferably, the photo-patternable material is organic. Further advantageous embodiments of the electronic component according to the invention are set forth in the appended claims.

It is noted that a dielectric material comprising dual layers is known per se, for example from an article of S. Y. Park et al ", Appl. Phys. Lett., 85 (2004) 2283-2285. This document discloses a dielectric comprising two layers being aimed at combining desirable characteristics, notably layers with good dielectric properties and specific surface chemistry. U.S. Pat. No. 4,907,046 discloses a multi-layer dielectric with improved dielectric breakdown properties. The design disclosed therein, including multiple inorganic layers, is not suitable for low-cost electronics.

A method according to the invention comprises the steps of:

forming a first electrically conducting layer comprising a first electrode of the electronic component on a substrate, depositing an interlayer of a dielectric material on the first electrically conducting layer, said dielectric material comprising an electrically insulating material;

depositing a further layer of a dielectric material on the said interlayer of dielectric material, said further layer of dielectric material comprising a photo-patternable electrically insulating material;

structuring both said further layer and said interlayer, wherein the further layer of the dielectric material is used as a mask for the interlayer;

forming a second electrically conducting layer comprising a second electrode of the electronic component It is noted that the step of forming a layer may comprise a step of depositing a layer followed by a step of patterning the deposited layer. Alternatively, the step of forming a layer may be performed during the course of a single manufacturing step. Further advantages embodiments of the method according to the invention are set forth in the appended claims.

These and other aspects of the invention will be discussed in further detail with reference to figures wherein like references relate to like items.

DETAILED DESCRIPTION OF THE DRAWINGS

Figure 1:
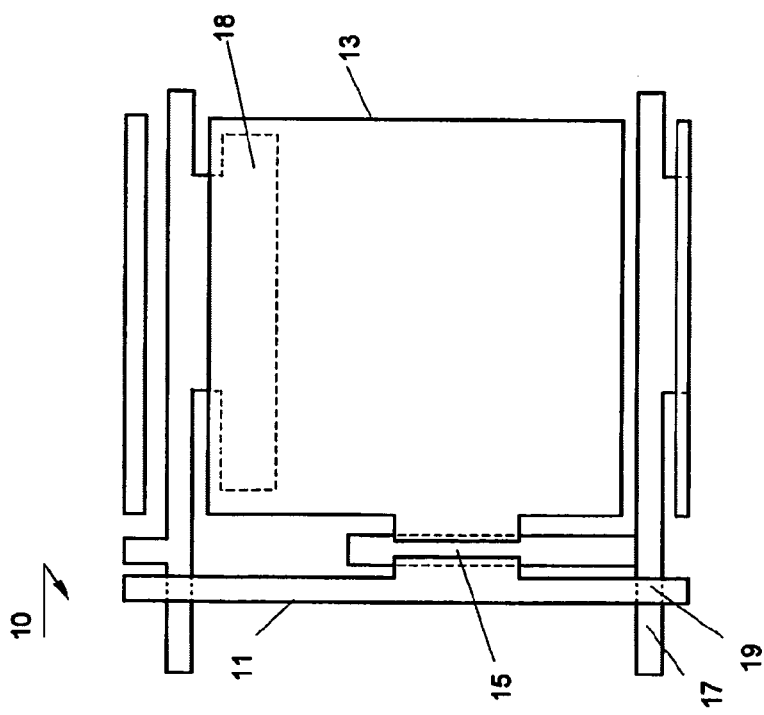
FIGS. 1(a) and 1(b) presents schematic views of an illustrative embodiment of the electronic component, according to the invention.
Figure 1:
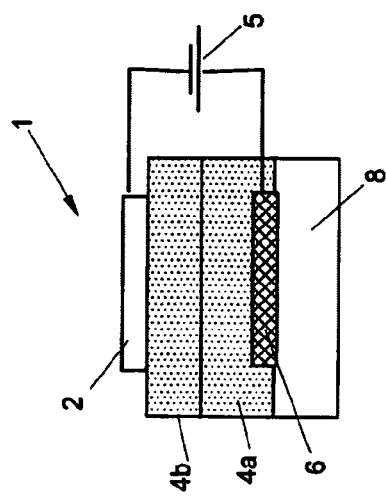

FIGS. 1 (a) and (b) presents schematic views of an embodiment of an electronic component according to the invention. The illustrative embodiment schematically depicts a pixel component arrangement incorporated into a display unit, notably a flexible display unit. Such pixel component arrangement comprises, for example, a thin film transistor 15, a storage capacitor 18, and/or a crossing of two electrically conducting layers 19.

A corresponding stack forming such structures is schematically illustrated by an item 1 of FIG. 1 view (b). The stack 1 comprises a substrate 8 whereon a first electrically conductive layer forming electrode 6 is deposited. A second electrode 2 formed by a second electrically conductive layer is separated from the first electrode 6 by a dielectric layer, comprising an interlayer 4a of an electrically insulating material, preferably having high resistance against electrical breakdown, and a further layer 4b of a photo-patternable insulating material, notably a photoresist material. Suitable materials for the interlayer 4a comprise organic materials, for example polyimide, polynorbornene, polycarbonate, polyparaxylylene, or parylene or inorganic materials with high time-dependent dielectric breakdown strength. Examples of a photo-patternable insulator material suitable to be used for the further layer 4b comprise SC-100, SU-8, or AZ-5214E material. It is noted that the bi-layer including layers 4a and 4b are implemented, for example, as an organic/organic bi-layer, or an organic/inorganic bi-layer, or inorganic/organic bi-layer. Suitable insulator materials and photo-patternable materials falling in respective chemical classes are known in the art. For example, for the organic insulator material, polynorbornene may be selected, whereas for the photo-patternable layer, SU8 material may be selected. For a bi-layer 4a/4b comprising 130 nm of polynorbornene and 300 nm of SU8, a time-to-breakdown is about 1250 s for the electrical field strength of 3.5 MV/cm. This provides an improvement of about 60 times the usual time-to-breakdown, comparison being made for a single layer of SU8. For inorganic insulator layer SiOx, SiNx, AlOx, AlN, AlOxNy HfOx, TiOx, BZT [Ba(ZrTi)O], BST [Ba(SrTi)O], TaOx or the like may be used. Such insulator layer in combination with, for example, an SU8 photo-patternable layer also provides a substantial improvement of the time-to-breakdown characteristic.

Preferably, a thickness of the interlayer 4a is selected to be at least 20 nm. It is found that layers having thickness less than 20 nm have pin holes, which may not be acceptable for providing a dielectric layer having improved electrical breakdown properties. In particular, the interlayer having a thickness of a monolayer is found not to be suitable for the invention, as pinhole-free mono-layers with sufficient insulating properties are generally not achievable with mass-manufacturing methods. The interlayer consists, for example, of a stack of layers of more than one material.

It will be appreciated that in the case where the structure 1 relates to a TFT, it further comprises one or more semiconductors wherein, or adjacent to which, conducting source and drain regions are provided. A plurality of suitable architectures is possible for integrating the electronic component (e.g., a TFT, a storage capacitor, or a crossing of two electrically conducting layers) into a suitable electronic device such as, for example, a flexible display apparatus. Notably, a suitable three-dimensional integrated circuit structure may be used. It is noted that in a case when the electronic component according to the invention relates to a TFT, either a bottom-gate or a top-gate architecture may be envisaged. For the semiconductor either an organic or an inorganic material may be selected. Preferably, for the substrate 8 a flexible carrier is selected—notably a foil. In order to control the operation of the TFT 15 or the storage capacitor 18 or crossings of two electrically conducting layers 19, the electrodes 2, 6 are supplied with suitable electric control voltages from an external source 5.

The circuit 10 presented in FIG. 1 view (*a*) schematically shows a portion of a suitable electronic device, notably a pixel, comprising a suitable plurality of elements, like an integrated TFT 15, a storage capacitor 18, and a crossing of electrically conducting layers 19. The circuit 10 forms, for example, part of a display, notably a flexible electronic display. Flexible displays may be used in portable electronic devices, like mobile phones, organizers or the like. The circuit 10 comprises, for example, an active matrix provided with a suitable plurality of integrated TFT's 15, storage capacitors 18, and crossings of electrically conducting layers 19. The active matrix is preferably arranged to collect data from a suitable matrix of data elements, like pixels. For this purpose a column data line 11 is provided cooperating with the pixel electrode 13 which communicates with the data line 11 via a suitable TFT 15. The row data is collected by the gate line 17 of the TFT 15.

Figure 2:
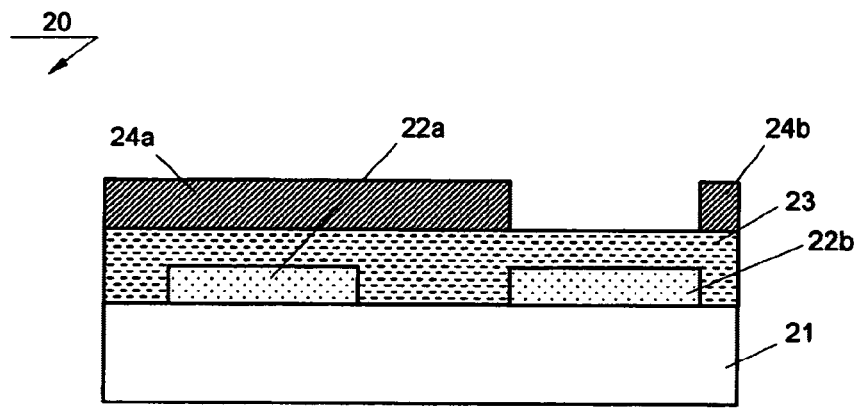
FIGS. 2 (a), (b) and (c) presents a series of schematic views of an electronic component during fabrication in accordance with an embodiment of the method of manufacturing an electronic component according to the invention.
Figure 2:
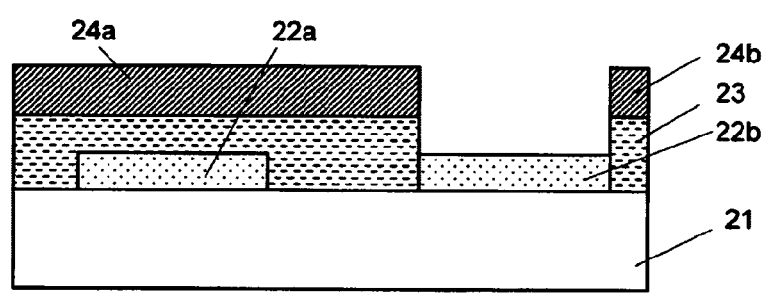
Figure 2:
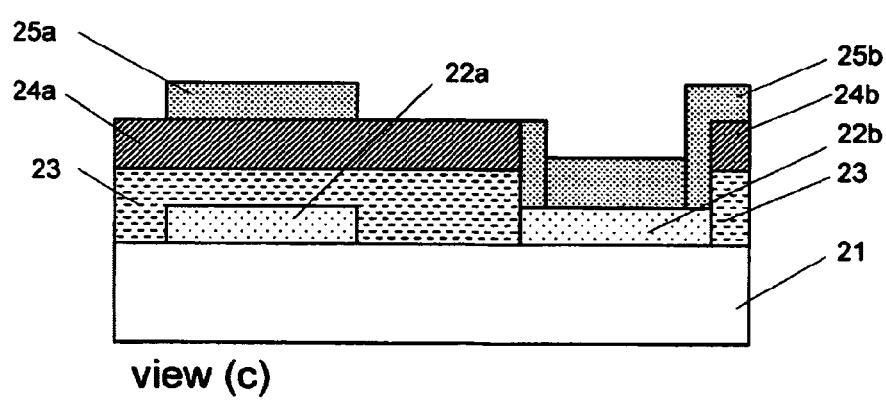

FIG. 2 views (*a*), (*b*) and (*c*) present a series of schematic views of an embodiment of a method of manufacturing a thin film transistor structure 20 according to the invention. First at a step represented by the structure depicted in view (*a*), a suitable electrically insulating interlayer 23, comprising a material with high time-dependent breakdown strength, is deposited on a first, preferably patterned, electrically conducting layer having portions 22a, 22b, deposited and structured on substrate 21. The electrically conducting layer is used, for example, to provide gate or source/drain electrodes for controlling TFT's and thereby enabling suitable operation of the electrical circuit of an electronic device. After a high time-dependent electrical breakdown insulator layer 23 is deposited, it is at least partially covered by a further layer of a photo-patternable electrically insulating material, notably a photoresist material. The photoresist material is deposited, for example, using a spin-coating, spray coating, slit coating or any other conventional resist coating method. The photoresist material is subsequently structured, for example, using UV lithography yielding portions 24a, 24b.

Subsequently during a step represented by the structure depicted in view (*b*), the interlayer 23 having high time-dependent electrical breakdown properties is suitably structured, whereby the photoresist material 24a, 24b are used, for example, as a mask for said structuring. Preferably, the interlayer 23 is structured using a dissolution technique in order not to modify a surface of the dielectric material 23. It is noted that when the layers 24a, 24b and 23 are structured simultaneously, wherein the photoresist material is used as a mask for the layer 23, a reduction of processing steps is obtained, and cost-efficiency of the fabrication process improves.

Preferably, the photo-patternable layer is conceived to be processed using a developer solution. In this case it is advantageous to provide a material for the interlayer 23 which is soluble in the developer solution of the photoresist layer. Thus, the area of the photoresist layer exposed to UV radiation and underlying regions of the interlayer 23 are removed in a single step. More preferably, when patterning the interlayer 23 the structure 20 does not have to be fully immersed in a solvent. Solvent exposure can be limited to the areas conceived to be patterned, for example by means of partial immersion of the structure 20 in the solvent. Apart from partial immersion in a solvent or etchant a paste with dissolving or etching properties may be used. This paste can be applied locally by various techniques, including printing.

During a step represented by the structure depicted in FIG. 2 view (*c*), a suitable second layer comprising an electrically conducting material is deposited on the structure depicted in FIG. 2 view (*b*). After suitable patterning of the second electrically conducting layer, contact portions 25a, 25b are provided. It is noted that the described method is applicable for manufacturing inorganic or organic electronics, for example, for flat-panel displays. The described processing is compatible with thin polymer substrates, enabling the fabrication of flexible devices such as rollable or wrappable displays.

Although the example described and shown in FIG. 1 views (*a*) and (*b*) refers to a so-called bottom gate TFT structure, it is also possible to apply the same method for a top gate TFT structure in which the resulting dielectric bi-layer is stacked by application of an insulator interlayer followed by a photo-patternable material, as is discussed with reference to the foregoing.

Figure 3:
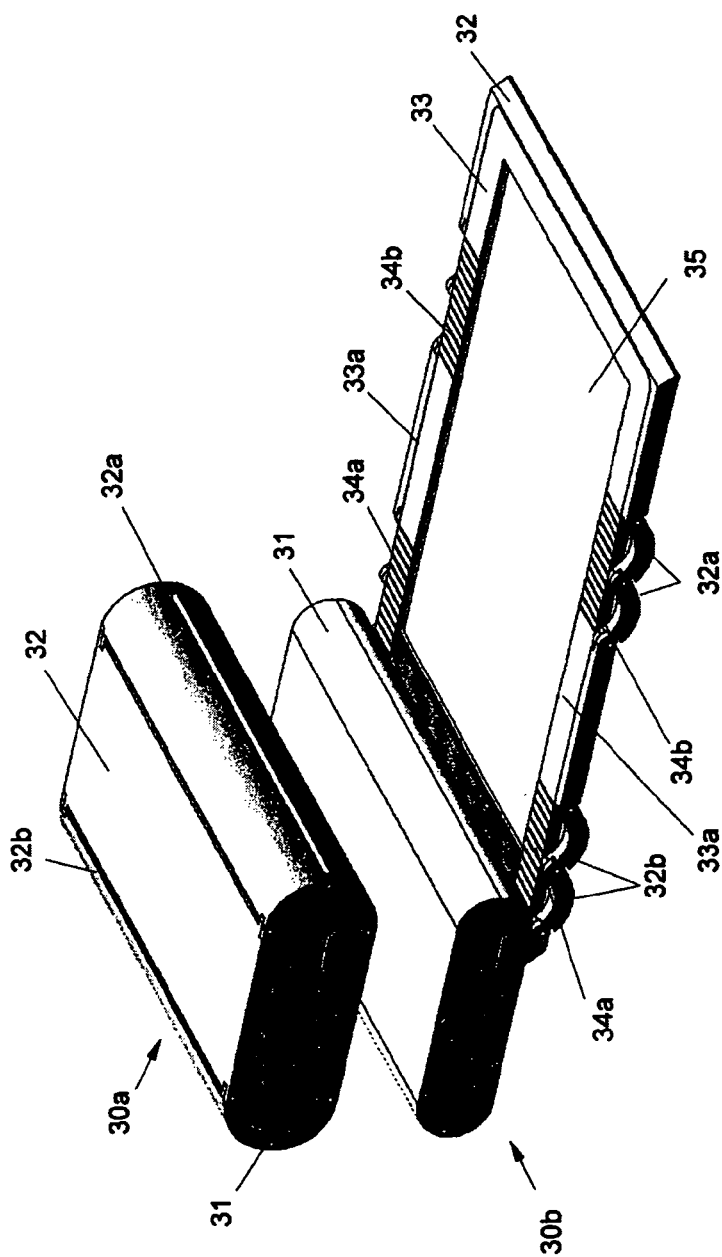
FIG. 3 presents a schematic view an embodiment of an electronic device incorporating the electronic components fabricated according to the illustrative embodiments of the invention described herein.

FIG. 3 presents a schematic view of an embodiment of the electronic device according to the invention. The electronic device 30 (shown in closed form as device 30a and open form as device 30b) comprises a body of the housing 31 about which the flexible display 35 is arranged to be wrapped. The housing 31 comprises, for example, a substantially rigid cover 32 arranged to receive the flexible display 35 and to be collapsed or extended together with it. The flexible display 35 comprises active matrix electronics as discussed with reference to FIG. 1 views (*a*) and (*b*). The electronic device shown closed as device 30a and open as device 30b is implemented, by way of example, as a palm-top computer or a mobile phone. It is noted that other embodiments of the electronic device, such as a computer monitor, an electronic display screen or the like are contemplated as well. Due to the cost-effectiveness of the manufacturing process of the active matrix of the display 35, the retail price of electronic devices can be reduced. The cover 32 may comprise hinged bending areas 32a, 32b. The electronic device 30a/30b may further comprise an edge protector 33 arranged with rigid portions 33a and with flexible portions 34a, 34b, the latter corresponding to hinged areas 32a, 32b of the cover 32. In addition to side protection, back protection of the flexible display 35 is also provided.

It will be appreciated that although specific embodiments of the electronic component according to the invention are discussed separately for clarity purposes, interchangeability of compatible features discussed with reference to isolated figures is envisaged. While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below.

The invention claimed is:

1. An electronic component comprising a stack with a first electrically conductive layer and a second electrically conductive layer separated at least by a dielectric layer, wherein the dielectric layer comprises a further layer of a photopatternable electrically insulating material and an interlayer of an electrically insulating material which is at least partially covered by the further layer, and wherein:

the photo-patternable electrically insulating material is an organic photoresist which has been processed by a developer solution, and the interlayer is at least 20 nm thick and a solubility of the interlayer in the developer solution is less than a solubility of the photo-patternable electrically insulating material in the developer solution, the interlayer comprising more than one layer of organic material selected from the group consisting of polyimide, polynorbornene, polycarbonate, and polyparaxylylene, parylene, and/or inorganic material selected from the group consisting of SiOx, SiNx, AlOx, MN, AlOxNy HfOx, TiOx, BZT [Ba(ZrTi)O], BST [Ba(SrTi)O], and TaOx.

2. The electronic component according to claim 1, wherein the interlayer comprises an inorganic material.

3. The electronic component according to claim 1, wherein at least one of the first electrically conductive layer or the second electrically conductive layer comprises an organic material.

4. The electronic component according to claim 1, further comprising a thin film transistor, a capacitor, or an element of a stack device and a crossing between the first electrically conductive layer and the second electrically conductive layer.

5. An electronic circuit comprising the electronic component according to claim 1.

6. A flexible display comprising the electronic component according to claim 5.

* * * * *